(12) United States Patent
Okamura et al.

(10) Patent No.: US 7,961,830 B2
(45) Date of Patent: Jun. 14, 2011

(54) CLOCK AND DATA RECOVERY CIRCUIT HAVING WIDE PHASE MARGIN

(75) Inventors: Hitoshi Okamura, Seongnam-si (KR); Min-Bo Shin, Suwon-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 1109 days.

(21) Appl. No.: 11/508,619

(22) Filed: Aug. 23, 2006

(65) Prior Publication Data

US 2007/0047683 A1     Mar. 1, 2007

(30) Foreign Application Priority Data

Aug. 24, 2005 (KR) .......................... 10-2005-0077924

(51) Int. Cl.
*H04L 7/00* (2006.01)
(52) U.S. Cl. ........................................ 375/355; 375/371
(58) Field of Classification Search .................. 375/355, 375/354, 371; 327/141, 144
See application file for complete search history.

(56) References Cited

U.S. PATENT DOCUMENTS

| | | | | |
|---|---|---|---|---|
| 3,665,380 A * | 5/1972 | Stover | ........................... | 367/117 |
| 5,420,868 A * | 5/1995 | Chraplyvy et al. | ........... | 398/185 |
| 5,535,252 A * | 7/1996 | Kobayashi | ..................... | 375/371 |
| 6,002,279 A | 12/1999 | Evans et al. | | |
| 6,122,336 A | 9/2000 | Anderson | | |
| 2002/0044618 A1* | 4/2002 | Buchwald et al. | ............. | 375/355 |
| 2004/0252804 A1* | 12/2004 | Aoyama | ....................... | 375/376 |
| 2005/0270214 A1* | 12/2005 | Seknicka | ....................... | 341/155 |

FOREIGN PATENT DOCUMENTS

| | | |
|---|---|---|
| JP | 11-289250 | 10/1999 |
| JP | 2004-260867 | 9/2004 |
| KR | 1020040109971 A | 12/2004 |

OTHER PUBLICATIONS

Stefanos Sidiropoulos and Mark A. Horowitz, IEEE Journal of Solid-State Circuits, vol. 32, No. 11, Nov. 1997, "A Semidigital Dual Delay-Locked Loop" pp. 1683-1692.

* cited by examiner

*Primary Examiner* — David C. Payne
*Assistant Examiner* — Brian J Stevens
(74) *Attorney, Agent, or Firm* — F. Chau & Associates, LLC

(57) ABSTRACT

A clock and data recovery (CDR) circuit includes a sampler, a CDR loop and a phase interpolator. The sampler samples serial data in response to a recovery clock signal to generate a serial sampling pulse. The CDR loop transforms the serial sampling pulse into parallel data, generates a plurality of phase signals with a first speed based on the parallel data, and generates a phase control signal with a second speed higher than the first speed based on the plurality of phase signals. The phase interpolator generates the recovery clock signal by controlling a phase of a reference clock signal in response to the phase control signal. Therefore, the CDR circuit may recover data and a clock with a relatively high speed.

30 Claims, 8 Drawing Sheets

CLOCK AND DATA RECOVERY CIRCUIT HAVING WIDE PHASE MARGIN

CROSS-REFERENCE TO RELATED APPLICATION

This application claims priority under 35 USC §119 to Korean Patent Application No. 2005-77924, filed on Aug. 24, 2005, the entire contents of which are herein incorporated by reference.

BACKGROUND OF THE INVENTION

1. Technical Field

The present disclosure relates to clock and data recovery circuits, and more particularly to clock and data recovery circuits operating at high speeds and having reduced phase errors.

2. Discussion of the Related Art

In high-speed data communications, serial data transfers have more advantages compared with parallel data transfers; for example, serial data transfers require fewer channels and induce less interference between signals. In the case of transferring serial data signal at high speeds, a frequency clock for recovering serial data is generally recovered from the serial data signal. In order to accurately recover the serial data included in the serial data signal, the phase of the received serial data signal and the phase of the recovered frequency clock need to be synchronized. A circuit that recovers the frequency clock to be synchronized with the data signal is referred to as a clock and data recovery (CDR) circuit.

In U.S. Pat. No. 6,002,279 and U.S. Pat. No. 6,122,336, CDR methods using phase interpolators are disclosed. The methods according to U.S. Pat. No. 6,002,279 and U.S. Pat. No. 6,122,336, however, are difficult to adapt to spread spectrum clocking (SSC).

Because a clock signal typically has a single frequency, energy distribution of the clock signal is concentrated in a narrow frequency band, and the energy distribution has a large peak value. In the case of the clock signal having a high frequency (e.g., several GHz), a length of a circuit wire becomes similar to a wavelength of the clock signal, and some wires may even operate as an antennas the wavelength is shortened. Thus, electromagnetic radiation of a corresponding frequency and its harmonics may easily occur. In addition, an error between adjacent circuits may be increased because of electromagnetic interference (EMI). Therefore, there exist limits as to how much a clock frequency can be increased.

Accordingly, the SSC technique was introduced for reducing an EMI effect. The SSC technique includes lowering a peak value by spreading the energy distribution concentrated in a narrow frequency band over a large frequency band, thereby reducing the EMI effect at substantially the same energy levels. More specifically, the SSC technique modulates the clock frequency according to a modulation profile having a predetermined rate of change, thereby preventing the EMI effect and increasing a maximum clock frequency, that is, a nominal frequency.

In transferring high-speed serial data with the SSC technique, the serial data signal has a relatively high frequency that constantly changes within a predetermined frequency band. Thus, a CDR circuit capable of constantly keeping up with clock changes and operating at high speeds is required. In a data transfer standard of the Serial Advanced Technology Attachment (SATA), a capability of keeping up with a frequency variation of more than about 0.5%, that is, 5,000 ppm, is required. To satisfy the above condition, a phase detector and a loop filter need to have very high speeds. It is difficult, however, to increase the operating speed and the frequency variation to more than 300 MHz and 2,000 ppm, respectively, in the phase detector and loop filter of a generic digital logic circuit. The limit to the frequency variation may be overcome by adapting a source-coupled logic (SCL) capable of implementing a high-speed logic circuit and by increasing pipeline steps; however, the chip size or power consumption may be considerably increased.

FIG. 1 is a block diagram illustrating a conventional CDR circuit. The conventional CDR circuit of FIG. 1 converts high-speed serial data into low-speed parallel data, and then detects a phase difference of the converted parallel data.

Referring to FIG. 1, the CDR circuit includes a sampler 11, a deserializer (serial-parallel converter) 12, a phase detection logic 13, a loop filter 14, a phase interpolation controller 15, a phase interpolator 16, a frequency divider 17, and a phase-locked loop 18.

The phase-locked loop 18 generates four reference clock signals that respectively have a frequency of f/2 Hz and a phase difference of about 90° between each other. The phase interpolator 16 receives the reference clock signals and adjusts the phases, to generate four recovery clock signals that respectively have a frequency of f/2 Hz and a phase difference of about 90° between each other. The phase interpolator 16 provides the recovery clock signals to the sampler 11.

The frequency divider 17 lowers an inputted frequency by 1/n, and outputs the lowered frequency. That is, the frequency divider 17 transforms the inputted f/2 Hz clock signal into an f/2n Hz clock signal, and then provides the f/2n Hz clock signal as an operating clock of the deserializer 12, the phase detection logic 13, the loop filter 14 and the phase interpolation controller 15.

The sampler 11 samples serial data INPUT having f bps, and provides a sampled signal to the deserializer 12. The deserializer 12 transforms the sampled signal into two n-bit parallel data IDATA and QDATA. At least one of the transformed n-bit parallel data IDATA and QDATA may be provided to the exterior as recovery data DATA.

The phase detection logic 13 generates one of a pulse signal UP and a pulse signal DOWN corresponding to the respective n-bit parallel data IDATA and QDATA. The pulse signals UP/DOWN are used for changing a phase of the operating clock.

The pulse signals UP/DOWN are inputted to the loop filter 14. The loop filter 14 is a kind of digital filter that transforms a high-frequency pulse into low-frequency edges. An output of the loop filter 14 is provided to the phase interpolation controller 15, and then transformed into a phase control signal CTL. The control signal CTL is provided to the phase interpolator 16. The phase interpolator 16 changes phases of the four reference clock signals in response to the phase control signal CTL. The phase interpolator 16 generates the four recovery clock signals, the phases of which are compensated, and provides the four recovery clock signals to the sampler 11.

In the circuit of FIG. 1, because the phase is detected based on the parallel data, the speed burden on the phase detector and the loop filter may be reduced. For example, in case that n is 20, phases of respective 20-bit parallel data are detected, and thus phase control signals are respectively generated. In the case that the SSC technique is applied, however, the phase interpolator adjusts a phase at a relatively slow speed compared to the high speed of the input data. Therefore, the phase interpolator cannot keep up with a frequency variation of the input data, or a phase margin is greatly reduced.

SUMMARY OF THE INVENTION

Exemplary embodiments of the present invention provide a clock and data recovery (CDR) circuit capable of operating at high speed with reduced phase errors.

Exemplary embodiments of the present invention also provide a method of recovering a clock signal and data at high speed with reduced phase errors.

In exemplary embodiments of the present invention, a clock and data recovery (CDR) circuit includes a sampler, a CDR loop and a phase interpolator. The sampler samples serial data in response to a recovery clock signal to generate a serial sampling pulse. The CDR loop transforms the serial sampling pulse into parallel data, generates a plurality of phase signals with a first speed based on the parallel data, and generates a phase control signal with a second speed higher than the first speed based on the plurality of phase signals. The phase interpolator generates the recovery clock signal by controlling a phase of a reference clock signal in response to the phase control signal. The recovery clock signal may include four signals having phase differences of substantially 90° between each other.

The CDR loop may include a deserializer configured to transform the serial sampling pulse into the parallel data of n bits in response to the recovery clock signal; a phase detection logic configured to generate k first phase signals from k data groups in response to the recovery clock signal, the parallel data of n bits being divided by m bits into the k data groups; a selector configured to sum the k first phase signals sequentially with a predetermined phase interval to generate a second phase signal; and a phase interpolation controller configured to generate the phase control signal based on the second phase signal. The k data groups may be partially superimposed such that some bits of the respective data group are commonly included in the next data group.

The CDR loop may include a deserializer configured to transform the serial sampling pulse into the parallel data of n bits in response to the recovery clock signal; a phase detection logic configured to generate k first phase signals from k data groups in response to the recovery clock signal, the parallel data of n bits being divided by m bits into the k data groups; a loop filter configured to filter the k first phase signals to generate k second phase signals; a selector configured to sum the k second phase signals sequentially with a predetermined phase interval to generate a third phase signal; and a phase interpolation controller configured to generate the phase control signal based on the third phase signal. The k data groups may be partially superimposed such that some bits of the respective data group are commonly included in the next data group.

In exemplary embodiments of the present invention, a method of a CDR includes: sampling serial data in response to a recovery clock signal to generate a serial sampling pulse; transforming the serial sampling pulse into parallel data; generating a plurality of phase signals with a first speed based on the parallel data; generating a phase control signal with a second speed higher than the first speed based on the plurality of phase signals; and generating the recovery clock signal by controlling a phase of a reference clock signal in response to the phase control signal, the reference signal being externally provided. The recovery clock signal may include four signals having phase differences of substantially 90° between each other.

The parallel data may be n-bit parallel data, and generating the plurality of the phase signals may include: generating k first phase signals from k data groups in response to the recovery clock signal, the n-bit parallel data being divided by m bits into the k data groups; summing the k first phase signals sequentially with a predetermined phase interval to generate a second phase signal; and generating the phase control signal based on the second phase signal. The k data groups may be partially superimposed such that some bits of the respective data group are commonly included in the next data group.

The parallel data may be n-bit parallel data, and generating the plurality of phase signals may include: generating k first phase signals from k data groups in response to the recovery clock signal, the n-bit parallel data being divided by m bits into the k data groups; filtering the k first phase signals to generate k second phase signals; summing the k second phase signals sequentially with a predetermined phase interval to generate a third phase signal; and generating the phase control signal based on the third phase signal. The k data groups may be partially superimposed such that some bits of the respective data group are commonly included in the next data group.

Therefore, the CDR circuit may recover data and a clock signal having a wide phase margin from serial data with relatively high speed.

BRIEF DESCRIPTION OF THE DRAWINGS

Exemplary embodiments of the present invention can be understood in more detail from the following descriptions to be read in conjunction with the attached drawings, wherein like elements are represented by like reference numerals.

DETAILED DESCRIPTION OF EXEMPLARY EMBODIMENTS

Figure 1:
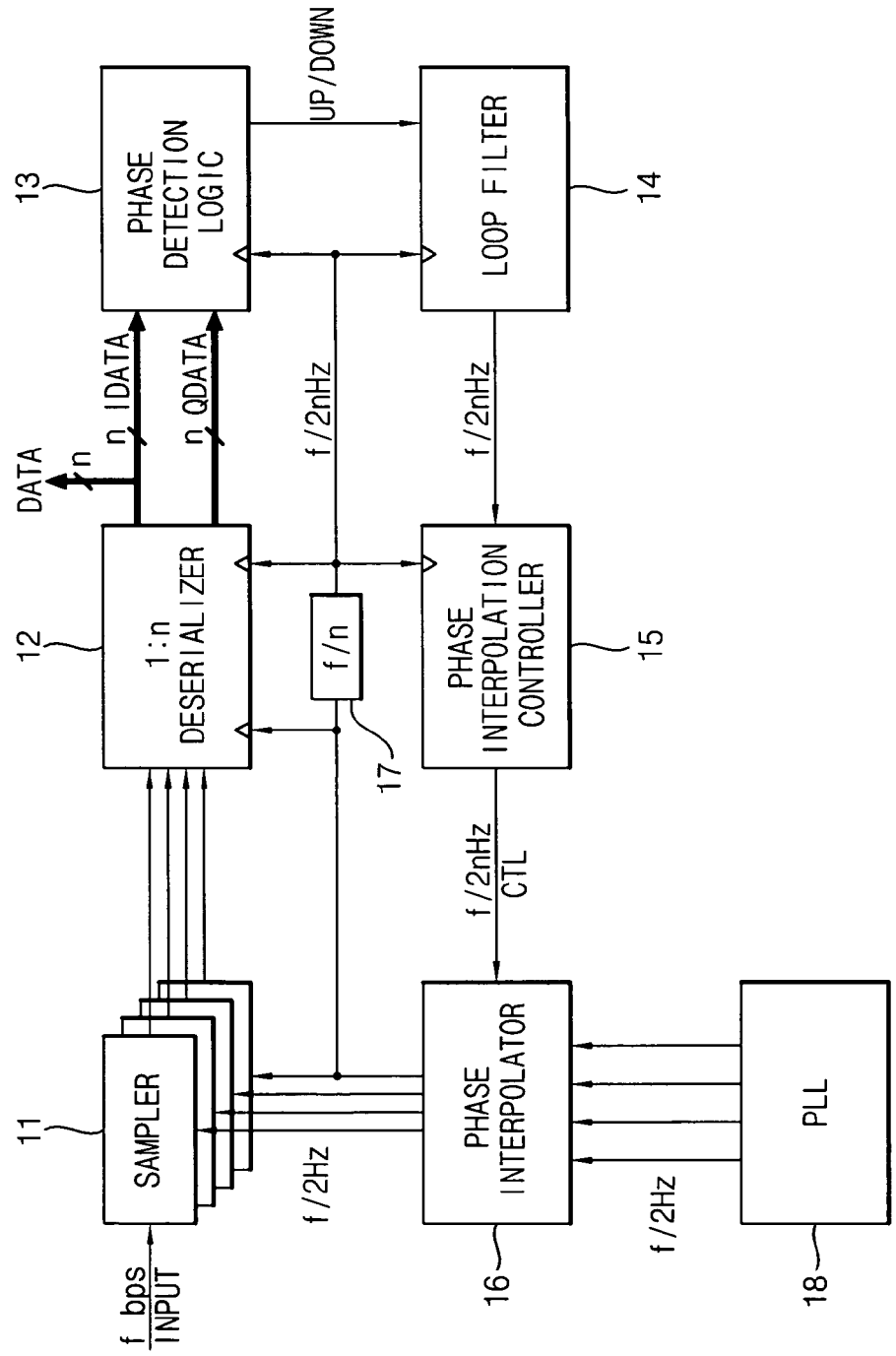
FIG. 1 is a block diagram illustrating a conventional clock and data recovery (CDR) circuit.
Figure 2:
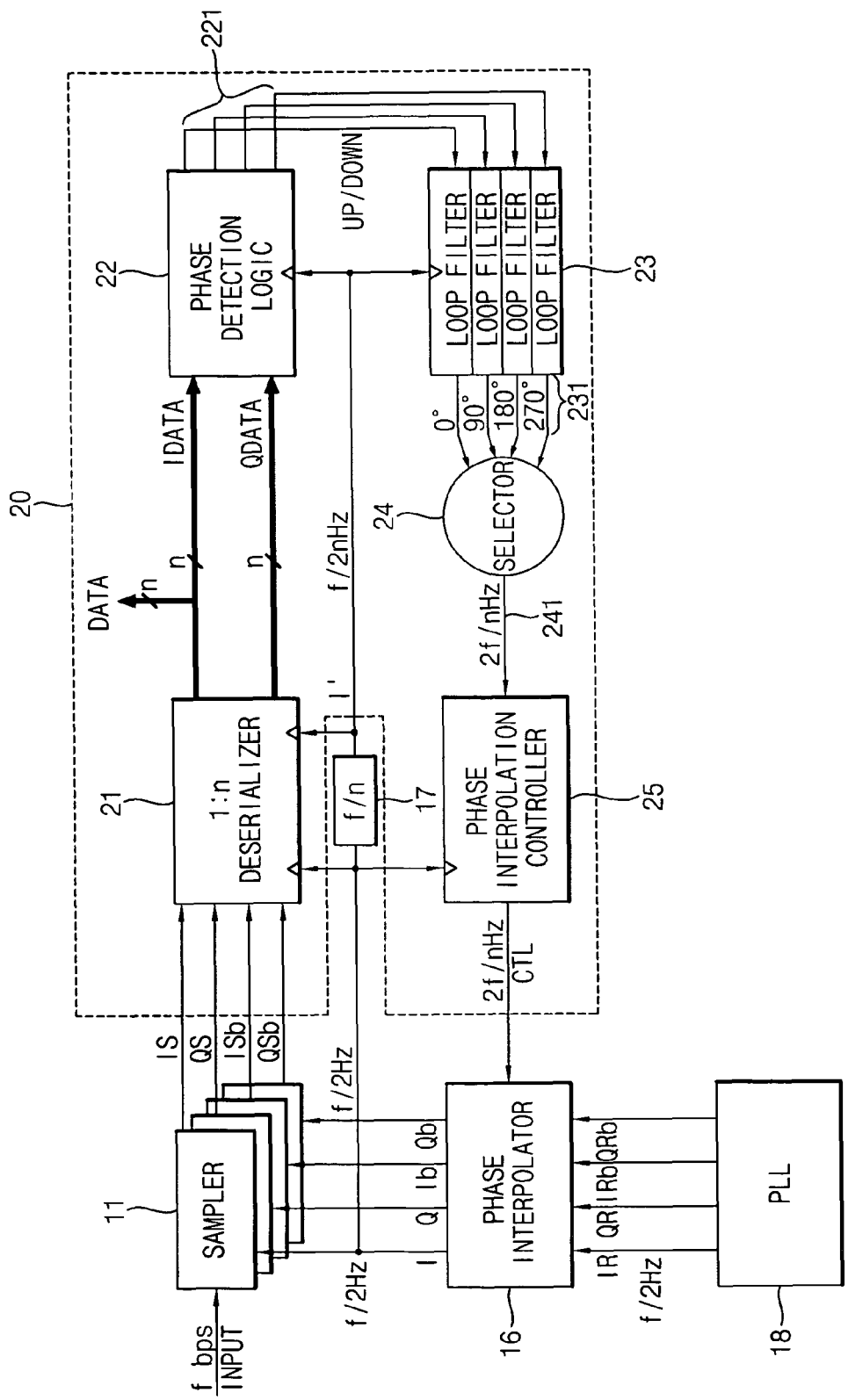
FIG. 2 is a block diagram illustrating a CDR circuit according to an exemplary embodiment of the present invention.

FIG. 2 is a block diagram illustrating a clock and data recovery (CDR) circuit according to an exemplary embodiment of the present invention.

Referring to FIG. 2, the CDR circuit includes a sampler 11, a phase interpolator 16, a frequency divider 17, a phase-locked loop 18 and a clock and data recovery loop 20. The clock and data recovery loop 20 includes a deserializer (serial-parallel converter) 21, a phase detection logic 22, a loop filter 23, a selector 24, and a phase interpolation controller 25.

The phase-locked loop 18 generates four reference clock signals IR, QR, IRb and QRb that respectively have a frequency of f/2 Hz and a phase difference of about 90° between each other. The four reference clock signals IR, OR, IRb and ORb may respectively have phases of about 0°, 90°, 180° and 270°.

The phase interpolator 16 receives the four reference clock signals IR, OR, IRb and QRb from the phase-locked loop 18, and then generates four recovery clock signals I, Q, Ib and Qb in response to a phase control signal CTL that is output from the phase interpolation controller 25. The four recovery clock signals I, Q, Ib and Qb are phase-controlled signals of the four reference clock signals IR, QR, IRb and QRb, respectively. The four recovery clock signals I, Q, Ib and Qb respectively have a frequency of f/2 Hz and may respectively have phases of about 0°, 90°, 180° and 270°. The phase control signal CTL is provided at a relatively high speed so that the phase interpolator 16 may adjust the phase so as not to be slow when compared with an input serial data INPUT signal.

The frequency divider 17 receives one recovery clock signal, for example 1, from among the four recovery clock signals I, Q, Ib and Qb, and then transforms the recovery clock signal I into a clock signal I' having a frequency of f/2n Hz to provide a clock signal I' to the deserializer 21, the phase detection logic 22 and the loop filter 23 as an operating clock. The relatively slow clock signal I' is provided to a low-speed part of the deserializer 21, the phase detection logic 22 and the loop filter 23 that do not need to be operated at high speed. A high-speed part of the deserializer 21 and the phase interpolation controller 25 receive the recovery clock signal I for high-speed operation.

For example, in the case where the input serial data INPUT is 6 Gbps and n is 20, an operating clock I of 3 GHz is provided to the high-speed part of the deserializer 21, the phase interpolator 16 and the phase interpolation controller 25, and an operating clock I' of 300 MHz is provided to the low-speed part of the deserializer 21, the phase detection logic 22 and the loop filter 23. In another example, in the case where the input serial data INPUT is 6 Gbps and n is 40, an operating clock I of 3 GHz is provided to the high-speed part of the deserializer 21, the phase interpolator 16 and the phase interpolation controller 25, and an operating clock I' of 150 MHz may be provided to the low-speed part of the deserializer 21, the phase detection logic 22 and the loop filter 23.

Figure 3:
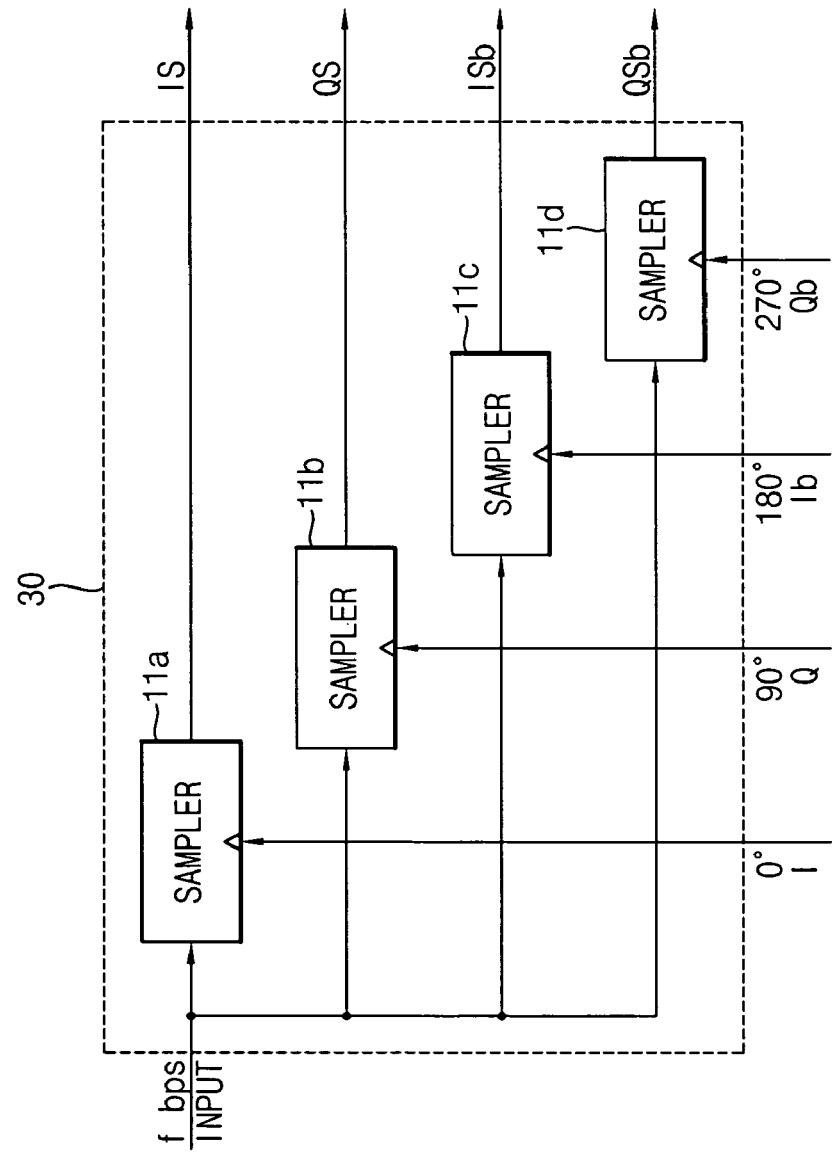
FIG. 3 is a block diagram illustrating a sampler of a CDR circuit according to an exemplary embodiment of the present invention.

FIG. 3 is a block diagram illustrating a sampler of a CDR circuit according to an exemplary embodiment of the present invention.

Referring to FIG. 3, the sampler 11 shown in FIG. 2 may sample f bps input serial data INPUT with the respective four recovery clock signals I, Q, Ib and Qb having phase differences of substantially 90° between each other, thereby extracting four serial sampling pulses IS, QS, ISb and QSb.

For example, in the case where the input serial data INPUT is 6 Gbps and, as show in FIG. 3, four samplers 11a, 11b, 11c and 11d are used, the four samplers 11a through 11d may sample the 6 Gbps input serial data INPUT with a frequency of about 3 GHz, to generate four 3 GHz serial sampling pulses IS, QS, ISb and QSb.

Figure 4:
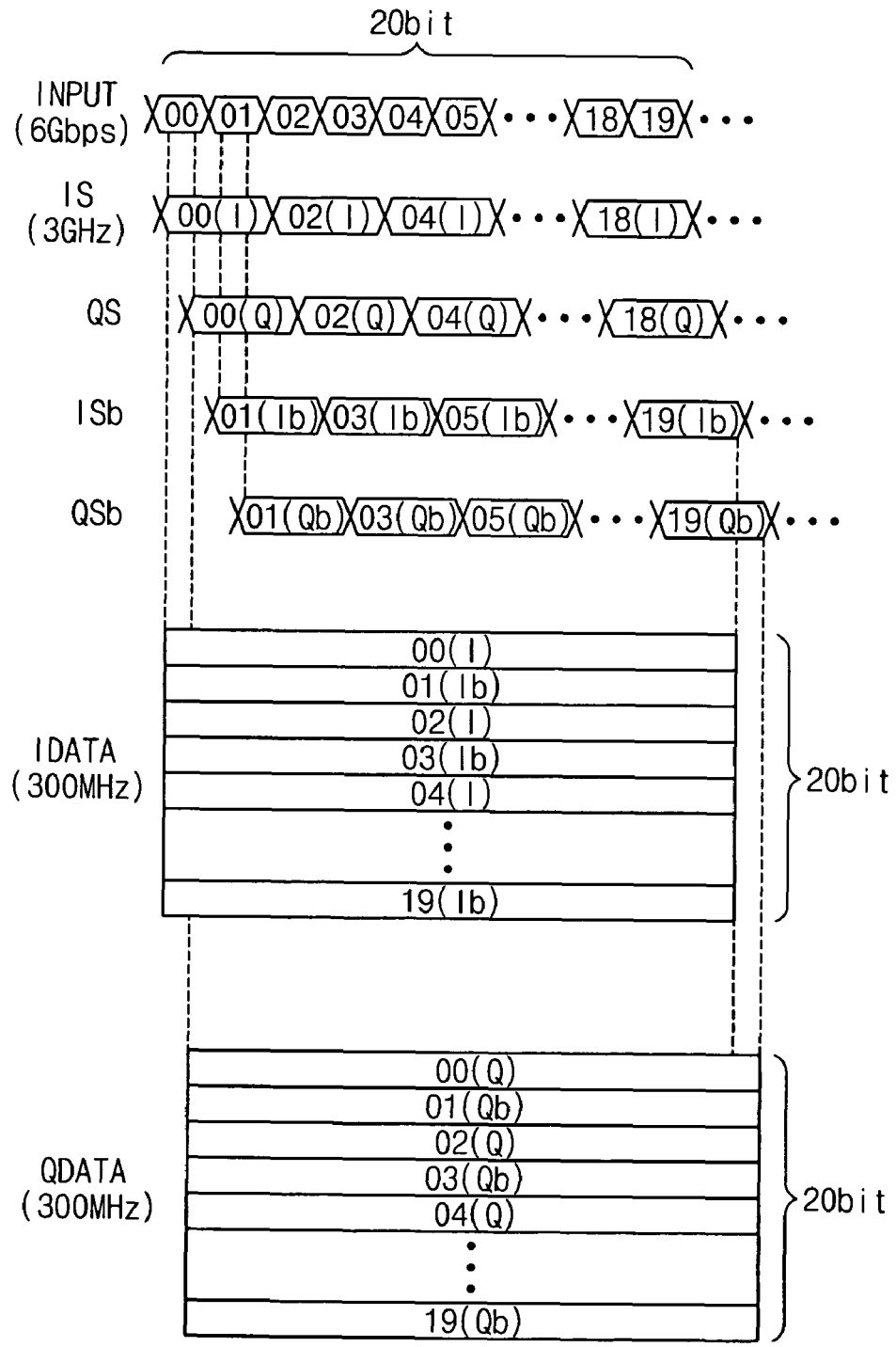
FIG. 4 illustrates an operation of a serial-parallel converter of a CDR circuit according to an exemplary embodiment of the present invention.

FIG. 4 illustrates an operation of a deserializer of a CDR circuit according to an exemplary embodiment of the present invention.

Referring to FIG. 4, the deserializer 21 shown in FIG. 2 transforms the four serial sampling pulses IS, QS, ISb and QSb into two n-bit parallel data IDATA and QDATA. The parallel data IDATA may be generated from the serial sampling pulses IS and ISb, and the parallel data QDATA may be generated from the serial sampling pulses QS and QSb.

For example, in the case where n is 20, the parallel data IDATA may include, among the serial sampling pulses, twenty pulses 00(I), 01(Ib), 02(I), 03(Ib), 04(I), . . . , 18(I), 19(Ib) that are sampled with the recovery clock signals I and Ib respectively having phases of 0° and 180°. Also, the parallel data QDATA may include twenty pulses 00(Q), 01(Qb), 02(Q), 03(Qb), 04(Q), . . . , 18(Q) 19(Qb) that are sampled with the recovery clock signals Q and Qb respectively having phases of about 90° and about 270°.

In another example, in the case where n is 40, the parallel data IDATA may include, among the serial sampling pulses, forty pulses that are sampled with the recovery clock signals I and Ib respectively having phases of 0° and 180°. Also, the parallel data QDATA may include forty pulses that are sampled with the recovery clock signals Q and Qb respectively having phases of about 90° and about 270°.

At least one of the two n-bit parallel data IDATA and QDATA may be provided to the exterior as recovery data DATA. Therefore, the circuit of FIG. 2 may recover a clock and data simultaneously.

Figure 5:
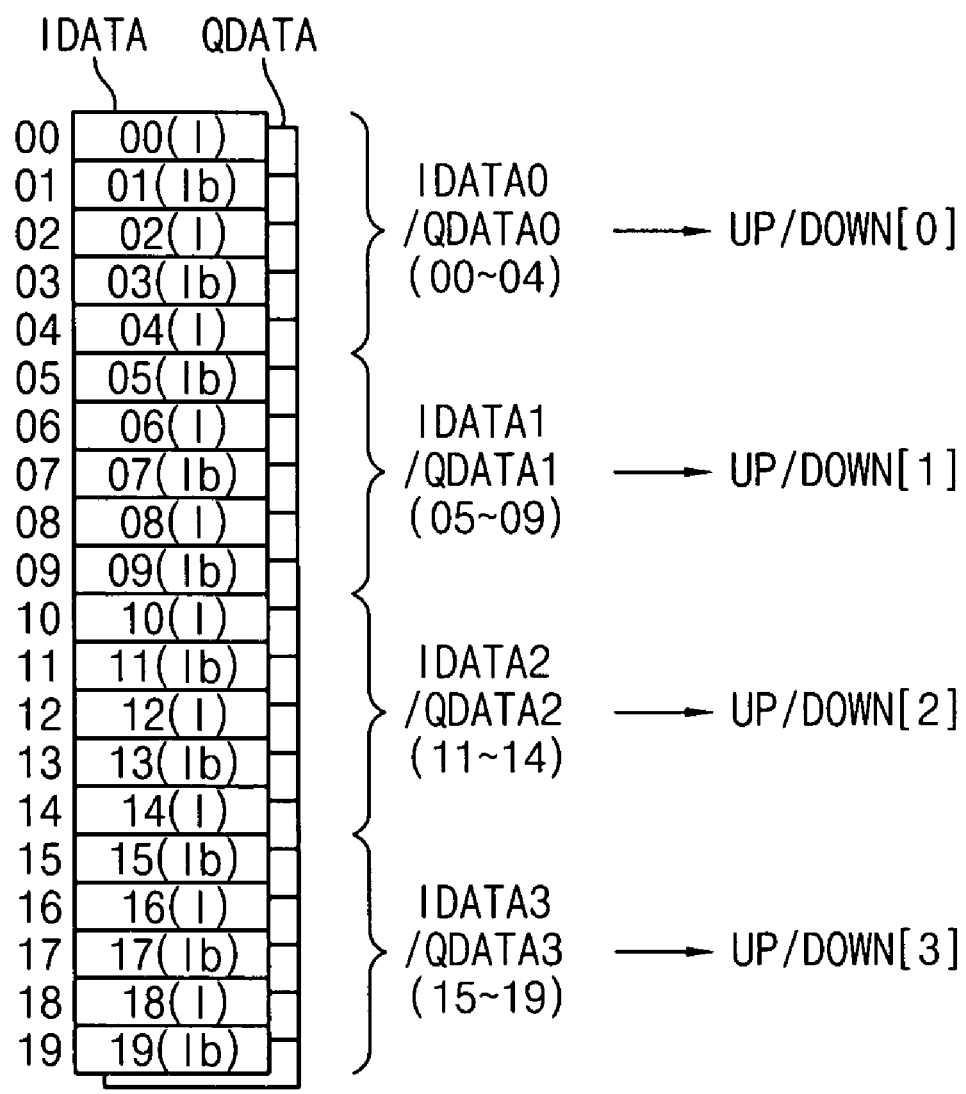
FIG. 5 illustrates an operation of a phase detector of a CDR circuit according to an exemplary embodiment of the present invention.

FIG. 5 illustrates an operation of a phase detector of a CDR circuit according to an exemplary embodiment of the present invention.

Referring to FIG. 5, the phase detection logic 22 shown in FIG. 2 may divide the recovered n-bit parallel data IDATA and QDATA by m bits into groups, respectively, and then generate a total of k first phase signals 221 from each of the divided m-bit parallel data groups IDATA0 through IDATA3 and QDATA0 through QDATA3. The first phase signals 221 may be an up/down signal UP/DOWN having information about whether the phase of the parallel data is leading or lagging. The number k may be a value of n divided by m. The phase detection logic 22 may provide the k first phase signals 221 to the loop filter 23 with a frequency of f/2n Hz.

For example, in case that 300 MHz 20-bit parallel data IDATA and QDATA recovered from a 6 Gbps serial data signal INPUT are respectively divided by 5 bits into groups, the phase detection logic 22 may generate a total of four first phase signals 221 from each of the 5-bit parallel data groups IDATA0 through IDATA3 and QDATA0 through QDATA3 with a frequency of 300 MHz.

In another example, in case that 150 MHz 40-bit parallel data IDATA and QDATA recovered from 6 Gbps input serial data INPUT are respectively divided by 5 bits into groups, the phase detection logic 22 may generate a total of eight first phase signals 221 from each of the 5-bit parallel data groups with a frequency of 150 MHz.

Figure 6A:
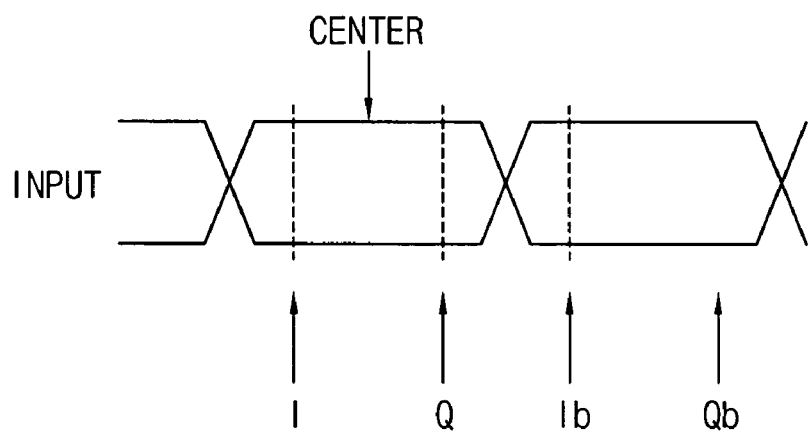
FIGS. 6A through 6C illustrate a method of phase detecting of a CDR circuit according to an exemplary embodiment of the present invention.
Figure 6B:
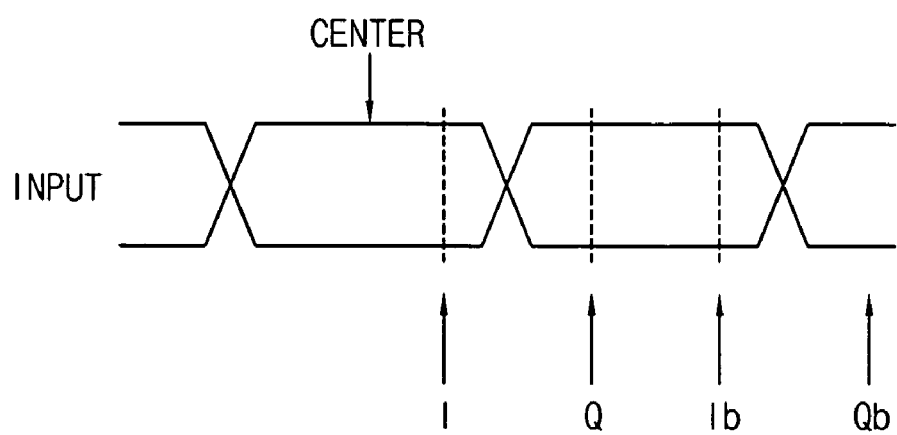
Figures 6C, 7:
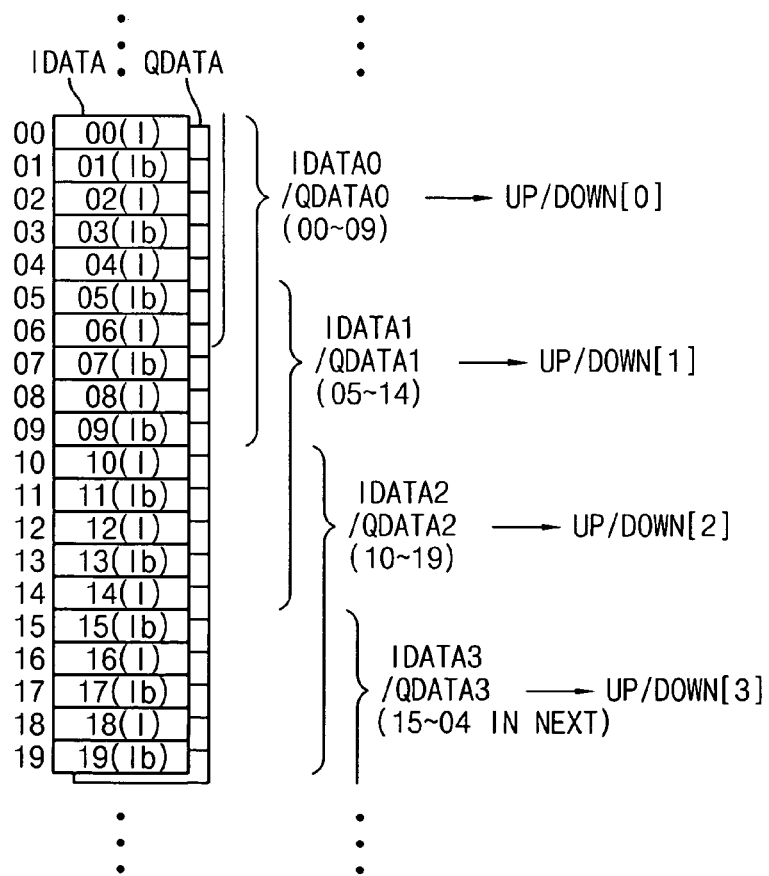
FIG. 7 illustrates an operation of a phase detector of a CDR circuit according to an exemplary embodiment of the present invention.

FIGS. 6A through 6C illustrate a method of detecting phases in a CDR circuit according to an exemplary embodiment of the present invention.

The method of detecting phases in the CDR circuit may be described with respect to an Alexander binary phase detection. According to the Alexander binary phase detection, sampled data signals with various phases are compared with each other so as to detect the phase of a clock signal.

Referring to FIG. 6A and FIG. 6B, locations of IS, QS and ISb among the serial sampling pulses IS, QS, ISb and QSb are compared with an ideal clock location for sampling the serial data signal, in order to detect the phase of the recovery clock signal I. Generally, in case of extracting data from a data pulse, it is preferable to extract the data in the middle point of the data pulse. The ideal point may be referred to as a reference phase point CENTER. The closer the recovery clock signal I, having phases of 0° among the recovery clock signals I, Q, Ib and Qb, approaches the reference phase point CENTER, the more accurately the data may be extracted.

In FIG. 6A, the recovery clock signals I leads the reference phase point CENTER. Therefore, the sampling pulses IS and OS among the serial sampling pulses IS, OS and ISb are the same as each other, and may be the same as ISb or different from ISb depending on the input serial data INPUT. When all of the three pulses IS, QS and ISb are substantially the same, the reference phase point cannot be decided. When the pulse IS and QS are the same as each other and are different from ISb, however, the recovery clock signals I may be determined as leading the reference phase point CENTER.

Similarly, as illustrated in FIG. 6B, in the case where QS and ISb among the serial sampling pulses IS, QS and ISb are the same as each other but different from IS, the phase of the recovery clock signals I may be determined to be lagging behind the reference phase point CENTER. In the case where the two pulses IS and ISb are the same as each other, the reference phase point may not be determined, or it indicates an error state.

FIG. 6C is a logic table illustrating possible cases in the waveforms of FIG. 6A and FIG. 6B. In the case where the pulses IS and QS are the same as each other but different from ISb, as illustrated in FIG. 6A, that is, in the case of "001" and "110", the down signal DOWN, which is a phase-lagging signal, is outputted because the phase of the recovery clock signals I is leading (LEAD). Similarly, in the case where the pulses QS and ISb are the same as each other but different from IS, as illustrated in FIG. 6B, that is, in the case of "011" and "100", the up signal UP, which is a phase-leading signal, is outputted because the phase of the recovery clock signals I is lagging (LAG). In case that all of the pulses IS, QS and ISb are the same as each other or the pulses IS and ISb are the same as each other, that is, in the case of "111" and "000", or "101" and "010", neither UP nor DOWN is outputted (TRI-STATE or ERROR) because the phase may not be decided.

The pulse IS, QS and ISb are also included in the parallel data IDATA and QDATA. Thus, the up/down signal UP/DOWN may be generated when the above method of phase detecting is performed on a plurality of m-bit parallel data groups IDATA0 through IDATA3 and QDATA0 through QDATA3 in the phase detection logic 22.

For example, when m is 5, the first parallel data groups IDATA0 and QDATA0 respectively have sampling pulses 00 (I), 01 (Ib), 02 (I), 03 (Ib), 04 (I) and 00 (Q), 01 (Qb), 02 (Q), 03 (Qb), 04 (Q) corresponding to serial data of 0 through 4. Thus, when the up/down signals are generated with respect to the sampling pulses 00 (I), 00 (Q) and 01 (Ib), the sampling pulses 01 (Ib), 01 (Qb) and 02 (I), the sampling pulses 02 (I), 02 (Q) and 03 (Ib), the sampling pulses 03 (Ib), 03 (Qb) and 04 (I), respectively, five, that is, m, up/down signals may be generated per each of the parallel data groups. When the five up/down signals are transferred through a predetermined filtering circuit, one up/down signal UP/DOWN may be generated per each of the parallel data groups. The predetermined filtering circuit may be implemented with an equalization filter. For example, when the up signals are detected more frequently than the down signals among the up/down signals generated per each of the parallel data groups, one up signal may be outputted. On the contrary, when the down signals are detected more than the up signals, one down signal may be outputted.

The phase information may be detected by using all of the four pulses IS, QS, ISb and QSb. For example, in the case where the pulses IS and QS are the same as each other, the pulses ISb and QSb are the same as each other, and the pulses QS and ISb are different from each other, that is, in the case of "0011" or "1100", the phase of the recovery clock signal I may be determined to be leading. In case that the pulses QS and ISb are the same as each other and all of the above-described pulses are not the same as each other, that is, in the case of "0001", "0110", "0111", "1000", "1001" or "1110", the phase of the recovery clock signal I may be determined to be lagging.

FIG. 7 illustrates an operation of the phase detector 22 of the CDR circuit according to an exemplary embodiment of the present invention.

Referring to FIG. 7, the phase detection logic unit 22 shown in FIG. 2 divides the recovered n-bit parallel data IDATA and QDATA by m' bits into groups and one part of each of the m' bits are overlapped with each other. A total of k first phase signals 221 are generated from each of the divided m'-bit parallel data groups with a frequency of f/2n Hz.

For example, 300 MHz 20-bit parallel data IDATA and QDATA recovered from 6 Gbps serial data signal INPUT are divided by 10 bits and the lower five bits are overlapped with the next parallel data group, respectively, and thus four parallel data groups are generated. That is, the parallel data IDATA and QDATA are divided so as to generate a first data group IDATA0' with number 0 bit through number 9 bit, a second data group IDATA1' with number 5 bit through number 14 bit, a third data group IDATA2' with number 10 bit through number 19 bit, and a fourth data group IDATA3' with number 15 bit through number 4 bit of the next 20-bit parallel data. In this manner, four first phase signals 221 may be generated with a frequency of 300 MHz from the four divided parallel data groups IDATA0' through IDATA3' by applying the method of detecting phases. Because a phase is detected based on the group including a relatively large number of bits, the phase may be detected more accurately.

For example, 150 MHz 40-bit parallel data IDATA and QDATA recovered from 6 Gbps serial data signal INPUT are divided by 10 bits into groups and the lower five bits are overlapped with the next parallel data group, respectively, and thus eight parallel data groups are generated.

The k loop filters 23 shown in FIG. 2 receive the k first phase signals 221. The loop filter 23 may filter the respective first phase signals 221, to generate k second phase signals 231. The second phase signals 231 are sequentially provided to the selector 24 shown in FIG. 2.

For example, the loop filter 23 may be implemented with a kind of digital filter that includes a bidirectional shift register. The shift register shifts a bit to the right or the left depending on the up signal or the down signal of the first phase signal 221 and outputs an up/down signal UP/DOWN as the second phase signal 231 when the shift register overflows.

For example, in the case where n is 20 and four first phase signals 221 are applied, the number of loop filters 23 is four and the loop filter 23 may generate four second phase signals 231. Also, in case that n is 40 and eight first phase signals 221 are applied, the number of loop filters 23 is eight and the loop filter 23 may generate eight second phase signals 231.

The loop filter 23 may not be used in some exemplary embodiments. That is, the first phase signals 221 may be directly inputted to the selector 24.

Because the phase detection logic 22 and the loop filter 23 are intended for parallel data of low speed, the phase detection logic 22 and loop filter 23 do not need to be a digital logic operating at high speed.

The selector 24 sums the second phase signals 231 with relatively low speed, sequentially with a predetermined phase interval, and then generates a third phase signal 241 with a relatively high speed. The third phase signal 241 is provided to the phase interpolation controller 25 shown in FIG. 2 with a frequency of 2f/n Hz.

For example, in the case where the input serial data is 6 Gbps, n is 20 and four second phase signals are applied, the selector 24 may sum four 300 MHz second phase signals 231, sequentially with the phase interval of about 90° between each other, and then may generate a 1.2 GHz third phase signal. Also, in the case where the input serial data is 6 Gbps, n is 40 and eight second phase signals are applied, the selector 24 may sum eight 150 MHz second phase signals 231, sequentially with the phase interval of about 45° between each other, and then may generate a 1.2 GHz third phase signal.

The selector 24 shown in FIG. 2 may sum the first phase signals 221 with relatively low speed instead of the second phase signals 231, sequentially with a predetermined phase interval, and then generate the third phase signal 241 with relatively high speed.

The phase interpolation controller 25 shown in FIG. 2 receives the third phase signal 241, to generate the phase control signal CTL with relatively high speed. The phase control signal CTL indicates to what extent the phase interpolator 16 shown in FIG. 2 adjusts the phase of the four reference clock signals IR, QR, IRb and QRb.

The phase interpolation controller 25 may be implemented with a finite state machine (FSM), which is similar to that described by Stefanos Sidiropoulos in the paper "A Semidigital Dual Delay-Locked Loop" (IEEE Journal of Solid-State Circuits, Vol. 32, No. 11, p. 1683-1692, November 1997). The phase interpolation controller 25 may generate the next phase control signal CTL based on a state of a present phase control signal and the inputted third phase signal 241. For example, the phase interpolation controller 25 may receive the 1.2 GHz third phase signal 241, to generate a 1.2 GHz phase control signal CTL.

In some embodiments, the phase control signal CTL may be a q-bit weight code for the respective reference clock signals IR, QR, IRb and QRb of the phase interpolator 16. The bit number q may be determined according to a phase amount that the phase interpolator 16 may control at one time, that is, according to the possible resolution.

The phase interpolator 16 shown in FIG. 2 receives the phase control signal CTL and the reference clock signals IR, QR, IRb and QRb, and makes the phase of the four reference clock signals IR, QR, IRb and QRb led or lagged by as much as a predetermined degree in response to the phase control signal CTL, and then generates the recovery clock signals I, Q, Ib and Qb. The phase interpolator 16 provides the generated recovery clock signals I, Q, Ib and Qb to the sampler 11 and the frequency divider 17 shown in FIG. 2. The phase interpolator 16 may sum the reference clock signals IR, QR, IRb and QRb with different weights from each other, and then may generate four phase-compensated recovery clock signals.

Because the phase control signal CTL that is inputted to the phase interpolator 16 is generated with relatively high speed compared to a control signal of the conventional art, the phase of the reference clock signal may be adjusted to have a relatively high speed compared to a conventional CDR circuit.

A method of weighting the four reference clock signals IR, QR, IRb and QRb by using the q-bit weight code may be implemented in various ways. Also, a method of summing weighted signals may be various. For example, similarly to a description in the paper by Stefanos Sidiropoulos, "A Semi-digital Dual Delay-Locked Loop" (IEEE Journal of Solid-State Circuits, Vol. 32, No. 11, p. 1683-1692, November 1997), when a voltage-controlled current amplifier that receives the four reference clock signals and is biased with a current source changing according to the q-bit weight code is used, current signals having four weights may be generated since an output is adjusted based on the weight code. When the current signals having four weights are respectively connected to four common loads and then summed, the four recovery clock signals I, Q, Ib and Qb may be generated by extracting a voltage of the common load.

Figure 8:
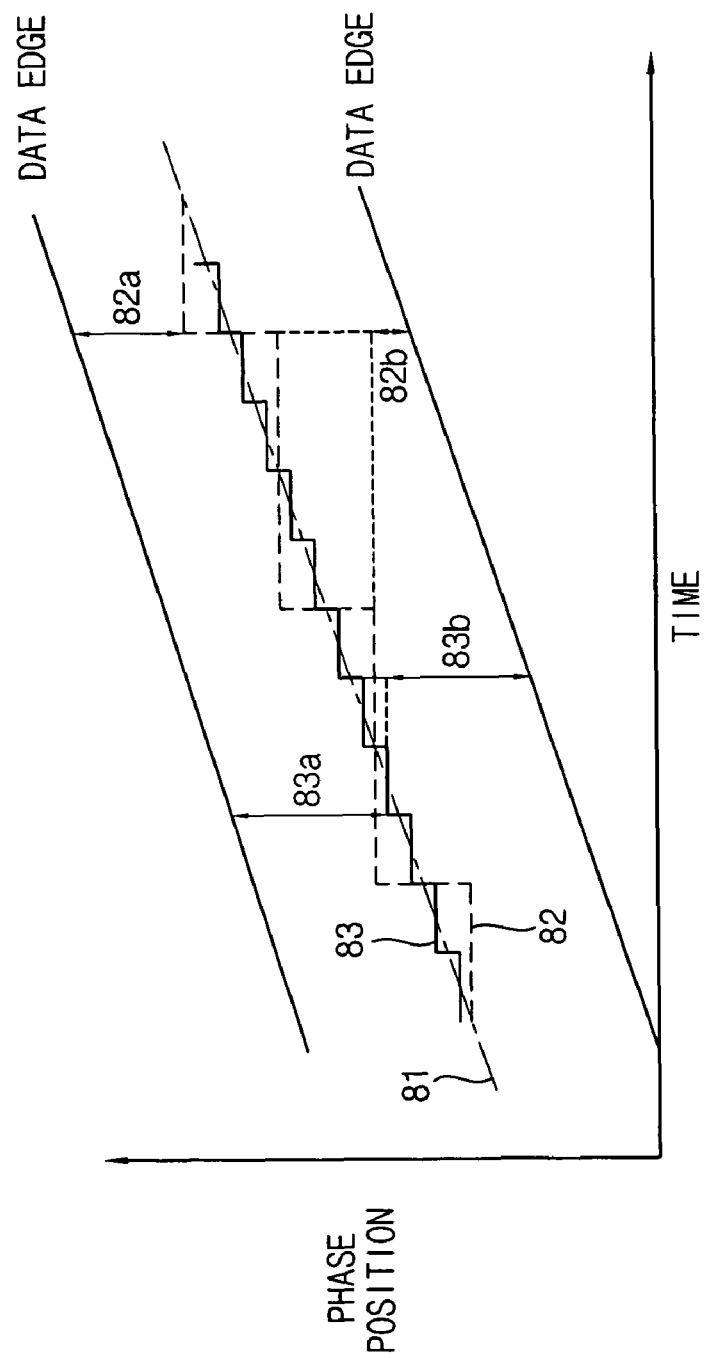
FIG. 8 illustrates a comparison result of a phase margin of a CDR circuit according to an exemplary embodiment of the present invention, and a conventional CDR circuit.

FIG. 8 illustrates a comparison result of a phase margin of the CDR circuit according to an exemplary embodiment of the present invention, and a conventional CDR circuit.

Referring to FIG. 8, two phases are illustrated with respect to a case when the frequency of the input serial data ascends along a predetermined spread spectrum clocking (SSC) profile 81, that is, a phase 82 of the conventional CDR circuit and a phase 83 of the CDR circuit according to an exemplary embodiment of the present invention. The phase 82 of the conventional CDR circuit has a slow phase change speed; however, the phase 82 has a wide range of phase fluctuation so as to follow the profile 81, and has a relatively wide phase margin 82a in a normal operation. In the case where, however, the phase is not changed once for some reason, the phase 82 has a very narrow phase margin 82b. Therefore, the conventional CDR circuit may fail to keep up with a clock and may fail to recover some data.

The phase 83 of the CDR circuit according to an exemplary embodiment of the present invention has a phase changing speed that is four times faster than the phase 82 and a range of phase fluctuation that is ¼ smaller than the phase 82 of the conventional CDR circuit. Thus, the phase 83 has a wide phase margin 83a in a normal operation, and maintains a wide phase margin 83b, even though the phase has not changed once.

The CDR method according to an exemplary embodiment of the present invention adjusts phases of four reference clocks by a high-speed phase control signal, to generate four recovery clock signals, and then samples high-speed serial data in response to the four recovery clock signals. According to the method, the sampled serial data are converted into low-speed parallel data that are used for detecting a plurality of phase information with low speed. Next, the high-speed phase control signal is generated in response to the plurality of phase information. Also, the method includes dividing the parallel data into a plurality of data groups to detect and filter the plurality of phase information with respect to each of the data groups, and then sequentially summing generated low-speed phase information, thereby generating the high-speed phase control signal.

As described above, the CDR circuit according to an exemplary embodiment of the present invention may recover data and a clock from serial data with relatively high speed, by detecting a plurality of phase information with relatively low speed in the phase detector operating at relatively low speed, by summing the plurality of phase information to generate a high-speed phase control signal, and by operating the phase interpolator with relatively high speed.

The CDR circuit according to an exemplary embodiment of the present invention may recover data and a clock from serial data with relatively high speed, in which a frequency changes regularly, by applying SSC.

In addition, the CDR circuit according to an exemplary embodiment of the present invention may maintain a phase level of the phase interpolator to be small, thereby reducing phase errors and also increasing phase-following speed.

Having thus described example embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A clock and data recovery (CDR) circuit comprising:
   a sampler configured to sample serial data in response to a recovery clock signal to generate a serial sampling pulse;
   a CDR loop configured to transform the serial sampling pulse into parallel data, to generate k phase signals simultaneously with a first speed based on the parallel data, and to generate a phase control signal with a second speed k times higher than the first speed based on the k phase signals, k being an integer greater than 1; and
   a phase interpolator configured to generate the recovery clock signal fed to the sampler by controlling a phase of a reference clock signal in response to the phase control signal from the CDR loop,
   wherein the CDR loop is configured to transform the serial sampling pulse into the parallel data of n bits, to generate the k phase signals with the first speed based on a plurality of data groups in response to a clock signal having a 1/n frequency relative to the recovery clock signal, and to generate the phase control signal with the second speed based on the k phase signals, the parallel data of n bits being divided into the plurality of data groups.

2. The CDR circuit of claim 1, wherein the recovery clock signal includes four recovery clock signals having phase differences of substantially 90° between each other.

3. The CDR circuit of claim 2, wherein the n-bit parallel data includes:
   first parallel data transformed from the serial sampling pulse that is sampled by the recovery clock signals corresponding to phases 0° and 180°; and
   second parallel data transformed from the serial sampling pulse that is sampled by the recovery clock signals corresponding to phases 90° and 270°.

4. The CDR circuit of claim 1, wherein the CDR loop comprises:
   a deserializer configured to transform the serial sampling pulse into the parallel data of n bits in response to the recovery clock signal;
   a phase detection logic configured to generate k first phase signals from k data groups in response to the recovery clock signal, the parallel data of n bits being divided by m bits into the k data groups;
   a selector configured to sum the k first phase signals sequentially with a predetermined phase interval to generate a second phase signal; and
   a phase interpolation controller configured to generate the phase control signal based on the second phase signal.

5. The CDR circuit of claim 4, wherein n is 20, m is 5, and k is 4.

6. The CDR circuit of claim 4, wherein n is 40, m is 5, and k is 8.

7. The CDR circuit of claim 4, wherein the k data groups are partially superimposed such that a predetermined number of bits of the respective data group are commonly included in the next data group.

8. The CDR circuit of claim 7, wherein n is 20, m is 10, the number of the common bits included in the two data groups is 5, and k is 4.

9. The CDR circuit of claim 7, wherein n is 40, m is 10, the number of the common bits included in the two data groups is 5, and k is 8.

10. The CDR circuit of claim 1, wherein the CDR loop comprises:
    a deserializer configured to transform the serial sampling pulse into the parallel data of n bits in response to the recovery clock signal;
    a phase detection logic configured to generate k first phase signals from k data groups in response to the recovery clock signal, the parallel data of n bits being divided by m bits into the k data groups;
    a loop filter configured to filter the k first phase signals to generate k second phase signals;
    a selector configured to sum the k second phase signals sequentially with a predetermined phase interval to generate a third phase signal; and
    a phase interpolation controller configured to generate the phase control signal based on the third phase signal.

11. The CDR circuit of claim 10, wherein n is 20, m is 5, and k is 4.

12. The CDR circuit of claim 10, wherein n is 40, m is 5, and k is 8.

13. The CDR circuit of claim 10, wherein the k data groups are partially superimposed such that a predetermined number of bits of the respective data group are commonly included in the next data group.

14. The CDR circuit of claim 13, wherein n is 20, m is 10, the number of the common bits included in the two data groups is 5, and k is 4.

15. The CDR circuit of claim 13, wherein n is 40, m is 10, the number of the common bits included in the two data groups is 5, and k is 8.

16. A method of recovering a clock and data, the method comprising:
    sampling serial data in response to a recovery clock signal to generate a serial sampling pulse;
    transforming the serial sampling pulse into parallel data;
    generating k phase signals simultaneously with a first speed based on the parallel data, k being an integer greater than 1;
    generating a phase control signal with a second speed k times higher than the first speed based on the k phase signals; and
    generating the recovery clock signal by controlling a phase of a reference clock signal in response to the phase control signal, the reference signal being externally provide,
    wherein the parallel data is n-bit parallel data, and generating the k phase signals with the first speed comprises generating the k phase signals with the first speed based on a plurality of data groups in response to a clock signal having a 1/n frequency relative to the recovery clock signal, the n-bit parallel data being divided into the data groups.

17. The method of claim 16, wherein the recovery clock signal includes four recovery clock signals having phase differences of substantially 90° between each other.

18. The method of claim 17, wherein the n-bit parallel data includes:
    first parallel data transformed from the serial sampling pulse that is sampled by the recovery clock signals corresponding to phases 0° and 180'; and
    second parallel data transformed from the serial sampling pulse that is sampled by the recovery clock signals corresponding to phases 90° and 270°.

19. The method of claim 16, wherein the parallel data is n-bit parallel data, and generating the k phase signals comprises:
    generating k first phase signals from k data-groups in response to the recovery clock signal, the n-bit parallel data being divided by m bits into the k data groups;
    summing the k first phase signals sequentially with a predetermined phase interval to generate a second phase signal; and generating the phase control signal based on the second phase signal.

20. The method of claim 19, wherein n is 20, m is 5, and k is 4.

21. The method of claim 19, wherein n is 40, m is 5, and k is 8.

22. The method of claim 19, wherein the k data groups are partially superimposed such that a predetermined number of bits of the respective data group are commonly included in the next data group.

23. The method of claim 22, wherein n is 20, m is 10, the number of the common bits included in the two data groups is 5, and k is 4.

24. The method of claim 22, wherein n is 40, m is 10, the number of the common bits included in the two data groups is 5, and k is 8.

25. The method of claim 16, wherein the parallel data is n-bit parallel data, and generating the plurality of phase signals comprises:

generating k first phase signals from k data groups in response to the recovery clock signal, the n-bit parallel data being divided by m bits into the k data groups;

filtering the k first phase signals to generate k second phase signals;

summing the k second phase signals sequentially with a predetermined phase interval to generate a third phase signal; and generating the phase control signal based on the third phase signal.

26. The method of claim 25, wherein n is 20, m is 5, and k is 4.

27. The method of claim 25, wherein n is 40, m is 5, and k is 8.

28. The method of claim 25, wherein the k data groups are partially superimposed such that a predetermined number of bits of the respective data group are commonly included in the next data group.

29. The method of claim 28, wherein n is 20, m is 10, the number of the common bits included in the two data groups is 5 and k is 4.

30. The method of claim 28, wherein n is 40, m is 10, the number of the common bits included in the two data groups is 5 and k is 8.

* * * * *